United States Patent [19]
Birgenheier et al.

[11] Patent Number: 5,140,613
[45] Date of Patent: Aug. 18, 1992

[54] BASEBAND MODULATION SYSTEM WITH IMPROVED ROM-BASED DIGITAL FILTER

[75] Inventors: Raymond A. Birgenheier, Spokane; David M. Hoover, Newman Lake, both of Wash.

[73] Assignee: Hewlett-Packard Company, Palo Alto, Calif.

[21] Appl. No.: 529,035

[22] Filed: May 25, 1990

[51] Int. Cl.$^5$ .............................................. H04L 27/18
[52] U.S. Cl. ....................................... 375/67; 332/103; 364/724.04
[58] Field of Search ........................ 375/67, 56, 57, 58, 375/30, 27; 332/103; 364/724.04

[56] References Cited

U.S. PATENT DOCUMENTS

| | | | |
|---|---|---|---|
| 4,680,556 | 7/1987 | Nakamura et al. | 332/62 R |
| 4,757,519 | 7/1988 | Collison et al. | 375/60 |
| 4,764,940 | 11/1986 | Paneth et al. | 375/67 |
| 4,961,206 | 10/1990 | Tomlinson et al. | 375/39 |

OTHER PUBLICATIONS

Lathi, "Modern Digital and Analog Communication Systems", 2d Ed., 1989, The Dryden Press, pp. 251-253.

*Primary Examiner*—Benedict V. Safourek
*Assistant Examiner*—Tesfaldet Bocure

[57] ABSTRACT

In a conventional ROM-based digital filtering methodology, N past samples of M-bit input symbols are used to address a memory containing a desired filtered output signal. This memory must have an address space of $2^{M*N}$. According to the present invention, a desired filtered output signal is defined as a composition of signal terms, each of which is a function of less than M*N bits. Individual ROMs are provided for each of these component terms. Address bits for the ROMs are derived from the N past samples of the M-bit input symbols. The ROM outputs are combined to yield the desired filtered output signal.

13 Claims, 5 Drawing Sheets

I-Q DIAGRAM OF QPSK MODULATION

I-Q DIAGRAM OF PI/4 DQPSK MODULATION
CONSTELLATION POINTS SHOWN AT SYMBOL TIMES

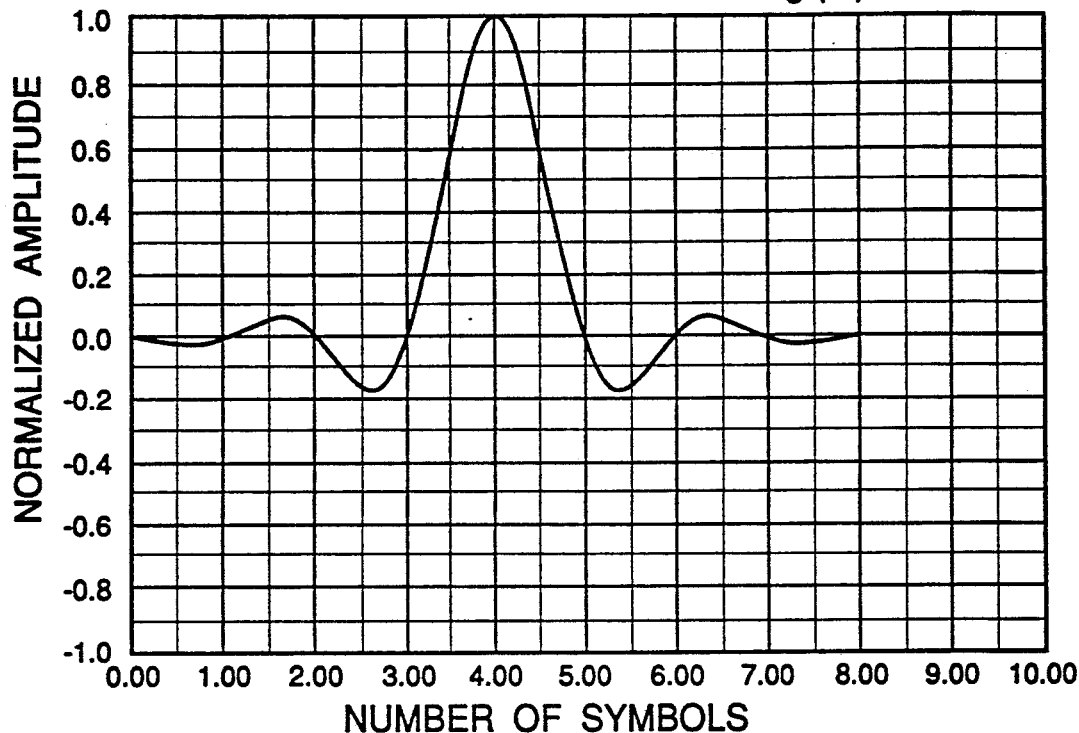
FIG. 6 Nyquist filter with α = 0.35
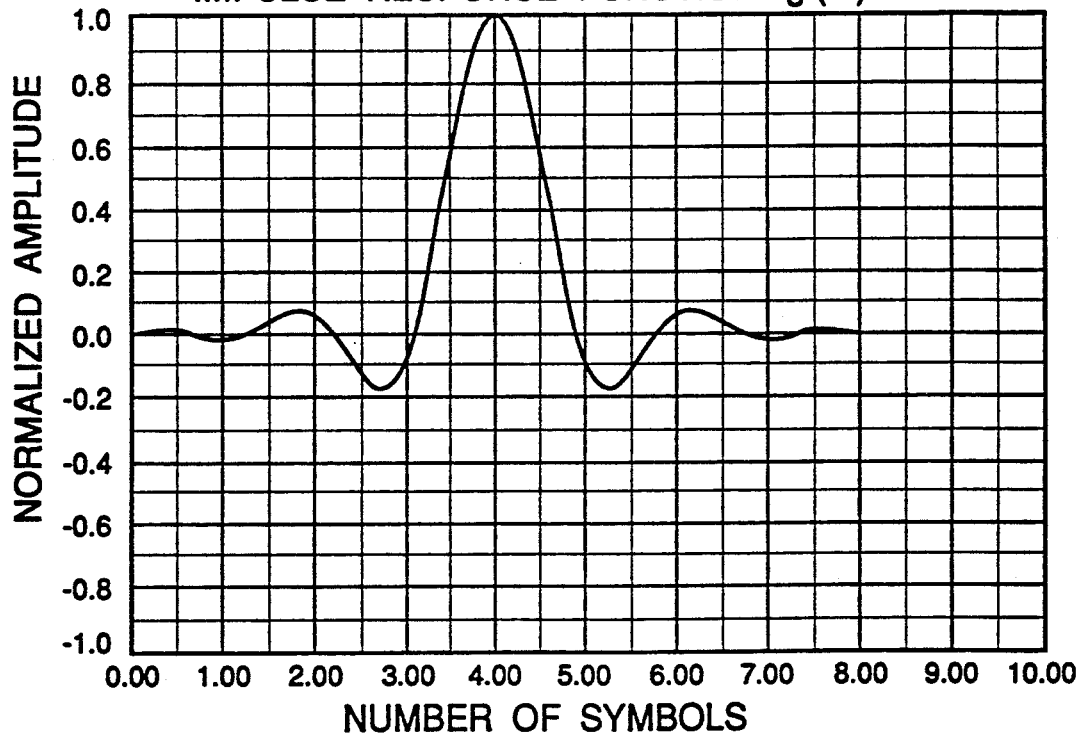
FIG. 7 Root Nyquist filter with α = 0.35

FIG. 8
Nyquist & Root Nyquist filter with $\alpha = 0.35$
64 Subintervals / Symbol
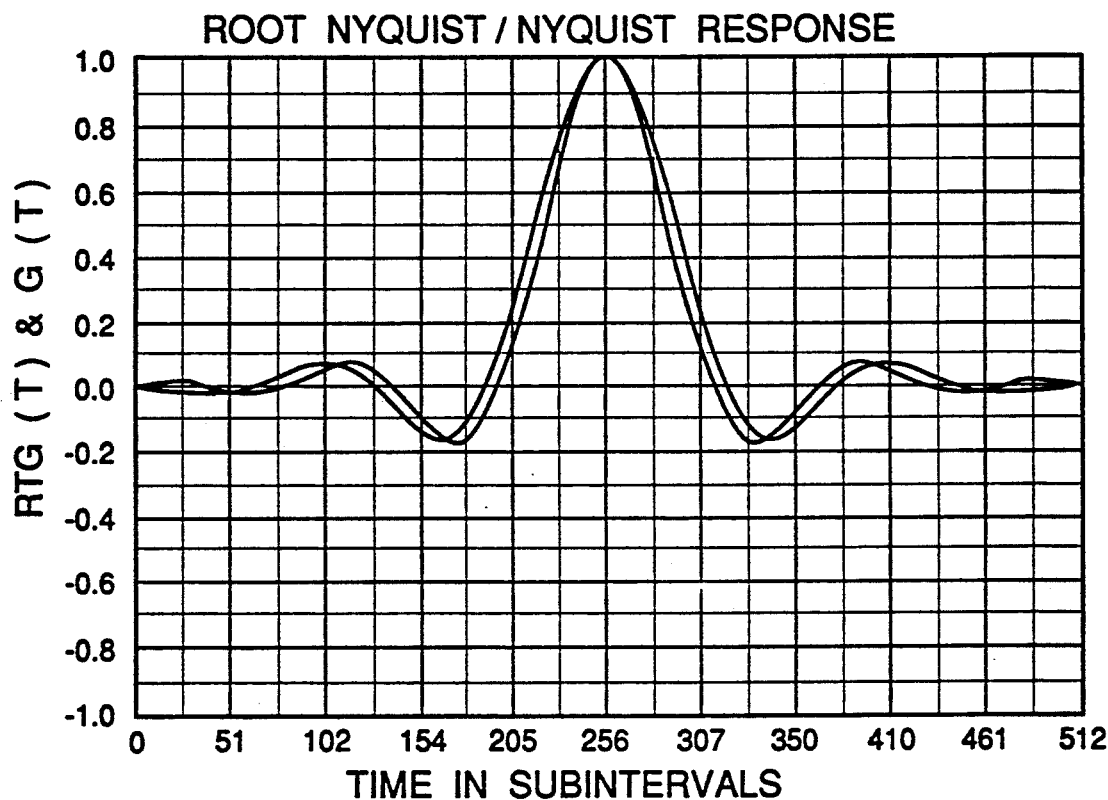
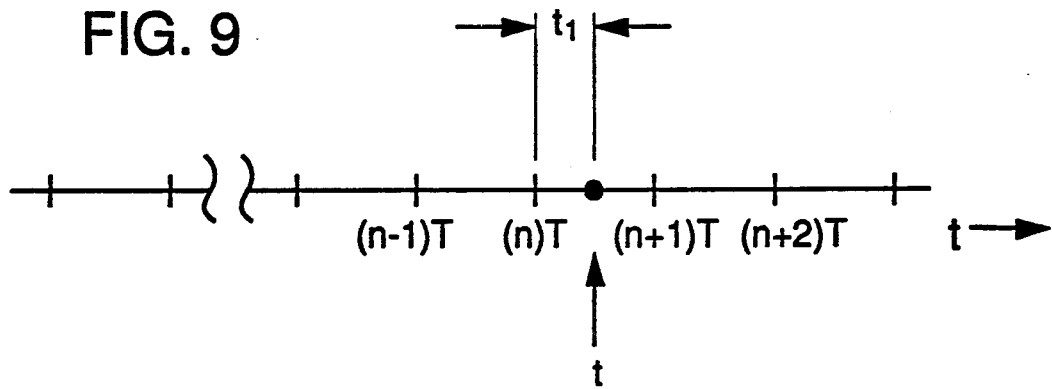
FIG. 9

BASEBAND MODULATION SYSTEM WITH IMPROVED ROM-BASED DIGITAL FILTER

FIELD OF THE INVENTION

The present invention relates to ROM-based digital filters, and more particularly relates to a baseband modulation system employing a ROM-based digital filter wherein the memory requirements of the component ROMs are substantially reduced over prior art designs.

BACKGROUND AND SUMMARY OF THE INVENTION

ROM-based digital filters are well known in the prior art. Reviewing briefly, the ROM in such a filter serves as a table in which the filter output signal corresponding to any combination of the past N input signal samples can be looked up. Each stored output signal is the discrete convolution of one possible combination of the past N input signal samples with the respective coefficients of the desired filter impulse response. By addressing the ROM with data corresponding to the past N input signal samples, the desired output signal corresponding thereto can be obtained.

ROM-based digital filters find application in certain quadrature phase modulation systems. Such systems utilize complex data that is typically represented with data "symbols" of two bits each, thereby permitting representation of the four quadrature phase states. Each state can also be represented by the magnitude of its real and imaginary components (I and Q). Due to the precise modulation required in phase modulation systems, digital filters are found to be advantageous.

There are several types of quadrature phase modulation systems. In one, the conventional "quadrature phase shift keying" (QPSK) system, each data symbol corresponds to a fixed phase point on the I-Q plane. Symbol (0,0) may correspond to a phase state of 0°, symbol (1,0) may correspond to a phase state of 90°, etc.

In QPSK there are 4 potential phase states on the I-Q diagram. In an I-Q reference plane in which the phase states are positioned on the axes (as shown by the solid axes in FIG. 1), the I magnitude can assume one of three values, −1, 0 or 1, in the four phase states. So too with the Q magnitude. If the coordinate axes are rotated 45°, so that none of the phase states falls on the axes (as shown by the dashed axes in FIG. 1), the I and Q magnitudes are constrained to just two values, 0.707 or 0.707, in the four phase states.

In a second type of quadrature phase modulation system, termed "differential quadrature phase shift keying" (DQPSK), a data symbol does not represent a fixed phase state, but rather represents a fixed increment of phase rotation from the signal's prior phase state. For example, symbol (0,0) may correspond to a phase increment of 0° from the last phase state, symbol (0,1) may correspond to a phase increment of 90° from the last phase state, etc. Like QPSK, the resultant I and Q magnitudes in DQPSK can be represented by a minimum of two values, depending on orientation of the I-Q plane.

In a third type of quadrature phase modulation system, termed "π/4 differential quadrature phase shift keying" (π/4 DQPSK), the output signal phase is incremented from the prior signal phase in accordance with the symbol data, just like DQPSK, and is further incremented by 45° (π/4) each successive symbol. This results in improved spectral quality in certain applications. The following table lists the phase shift resulting from each possible input symbol for the two modulation formats:

TABLE I

| SYMBOL | DQPSK Δφ | π/4 DQPSK Δφ |
|---|---|---|
| 00 | 0° | (0° + 45°) = 45° |
| 01 | 90° | (90° + 45°) = 135° |
| 10 | 270° | (270° + 45°) = 315° |
| 11 | 180° | (180° + 45°) = 225° |

π/4 DQPSK modulation is best understood with reference to an example illustrating its use with an arbitrary data sequence. As can be seen from the following, another way of interpreting the π/4 DQPSK sequence is as the DQPSK sequence advanced by an offset phase, in which the offset phase advances 45° (π/4 radians) during each successive symbol. In this example, the initial phase is 45°:

TABLE II

| Data: | 00 | 01 | 10 | 11 | 01 | 00 | 10 | 11 |
|---|---|---|---|---|---|---|---|---|
| φ for DQPSK: | 45° | 135° | 45° | 225° | 315° | 315° | 225° | 45° |
| offset phase: | 45° | 90° | 135° | 180° | 225° | 270° | 315° | 0° |
| φ for π/4 DQPSK: | 90° | 225° | 180° | 45° | 180° | 225° | 180° | 45° |

In π/4 DQPSK, it will be recognized that there are 8 potential phase states. In an I-Q reference plane in which alternating phase states are positioned on the axes (as shown by the solid axes in FIG. 2), the I magnitude can assume one of five values in the eight phase states. So can the Q magnitude. If the coordinate axes are rotated 22.5°, so that none of the phase states falls on the axes (as shown by the dashed axes in FIG. 2), the I and Q magnitudes are constrained to just four values in the eight phase states.

FIG. 3A shows a π/4 DQPSK modulation system 10 using conventional ROM-based filtering methodology. In the illustrated system, the pair of bits for each symbol are split from an input serial data stream $a_k$ by a serial to parallel converter 12. The first bit of each pair is provided on an output line $A_k$. The second bit of each pair is provided on an output line $B_k$. That is:

$$A_k = a_{2k}$$
$$B_k = a_{2k+1}$$

where $k = 0, 1, 2 \ldots$

These two binary data streams are provided to a differential encoder 14. The differential encoder 14 makes the necessary phase rotations needed to translate the $A_k$ and $B_k$ input data to the current phase state (i.e. incremented from the prior phase state in accordance with the current data symbol), and produces two binary data streams $X_k$ and $Y_k$. This function is accomplished by Boolean logic that implements the following functions:

$$\overline{X_k} = \overline{(A_k \oplus B_k)} \cdot (A_k \oplus \overline{X_{k-1}}) + (A_k \oplus B_k) \cdot (B_k \oplus Y_{k-1}) \quad (1)$$

$$\overline{Y_k} = \overline{(A_k \oplus B_k)} \cdot (B_k \oplus \overline{Y_{k-1}}) + (A_k \oplus B_k) \cdot (A_k \oplus X_{k-1}) \quad (2)$$

where $\oplus$ represents an exclusive OR function, + represents an OR function, · represents an AND function, and expressions $X_{k-1}$ and $Y_{k-1}$ indicate the previous outputs from the encoder 14. Again, outputs $X_k$ and $Y_k$ uniquely designate absolute, rather than relative phase states.

The $X_k$ and $Y_k$ binary data from the differential encoder are converted into I and Q magnitudes (termed $I_k$ and $Q_k$ herein) by the block 16 labelled "transfer to the unit circle." The $I_k$ and $Q_k$ values are filtered with ROM-based digital baseband filters 18, 20.

The foregoing will be made clearer by the following example, in which the initial values of $X_{k-1}$ and $Y_{k-1}$ equal one:

TABLE III

| $a_k$: | 00 | 01 | 10 | 11 | 01 | 00 | 10 | 11 |
|---|---|---|---|---|---|---|---|---|
| $A_k$: | 0 | 0 | 1 | 1 | 0 | 0 | 1 | 1 |
| $B_k$: | 0 | 1 | 0 | 1 | 1 | 0 | 0 | 1 |
| $A_k \oplus B_k$: | 0 | 1 | 1 | 0 | 1 | 0 | 1 | 0 |
| $A_k \oplus \overline{B_k}$: | 1 | 0 | 0 | 1 | 0 | 1 | 0 | 1 |
| $A_k \oplus \underline{X}_{k-1}$: | 0 | 0 | 0 | 1 | 1 | 0 | 1 | 0 |
| $B_k \oplus Y_{k-1}$: | 0 | 1 | 0 | 1 | 0 | 1 | 1 | 0 |
| $X_k$: | 1 | 0 | 1 | 0 | 1 | 1 | 0 | 1 |
| $Y_k$: | 1 | 1 | 1 | 0 | 0 | 0 | 0 | 1 |
| $C_k$: | $1/\sqrt{2}$ | $-1/\sqrt{2}$ | $1/\sqrt{2}$ | $-1/\sqrt{2}$ | $1/\sqrt{2}$ | $1/\sqrt{2}$ | $-1/\sqrt{2}$ | $1/\sqrt{2}$ |
| $D_k$: | $1/\sqrt{2}$ | $1/\sqrt{2}$ | $1/\sqrt{2}$ | $-1/\sqrt{2}$ | $-1/\sqrt{2}$ | $-1/\sqrt{2}$ | $-1/\sqrt{2}$ | $1/\sqrt{2}$ |
| $\Delta\phi$ | 0° | 90° | 270° | 180° | 90° | 0° | 270° | 180° |

The "transfer to unit circle" block 16 in FIG. 3A is conceptual in nature. This function is actually implemented by the data stored in the ROM-based filters 18, 20. The actual implementation of this part of the circuitry is shown in FIG. 3B. The filter ROMs 18, 20 are addressed by shift registers 22, 24 which buffer the $X_k$ and $Y_k$ binary data stream from the differential encoder. The N-bit words so produced (here N=8) address locations in the ROMs in which the desired filtered I and Q signals corresponding to the past N symbol samples are stored. (In addition to the N-bit address words from each of shift registers 22, 24, the address lines for each ROM are also driven with an M-bit subinterval counter (here M=4) that permits outputting of $2^M$ (16) subinterval states between the discrete input samples.)

It will be recognized that in this implementation, each ROM is driven with 2N+M address bits, requiring an address space of $2^{2N+M}$ words. This number becomes unwieldy in some applications. In the illustrated system 10, for example, each of ROMs 26, 28 must have an address space of $2^{20}$ for each channel. With currently available 16 address bit-ROMs, 16 ROMs are required for each channel, or a total of 32 for the illustrated system.

In accordance with the present invention, these memory requirements are reduced by defining each desired filtered output signal as the sum of two or more component terms. Each of these terms is uniquely defined by significantly less than the number of bits required by a conventional implementation (i.e. 2N+M), and thus can be stored and looked up in smaller memories. The outputs from these smaller memories can then be summed to yield the desired output signal.

In the illustrated application of the invention to a $\pi/4$ DQPSK modulator, the decomposition of the desired output signal into component terms is effected by exploitation of symmetries inherent in the modulation. These symmetries permit both the I and Q outputs to be defined as functions of a "sine" term and a "cosine" term. The I output is the difference between a sine term and a cosine term; the Q output is a sum.

The foregoing and additional features and advantages of the present invention will be more readily apparent from the following description thereof, which proceeds with reference to the accompanying drawings.

BRIEF DESCRIPTION OF THE DRAWINGS

FIG. 6 illustrates the impulse response for a Nyquist filter with an $\alpha$ of 0.35.

FIG. 7 is a plot of the impulse response of the root Nyquist filter used in the illustrated embodiment of the present invention.

FIG. 8 is a plot comparing the impulse responses of a Nyquist filter with a root Nyquist filter.

FIG. 9 is a diagram illustrating a portion of the timing nomenclature with which the present invention is described.

DETAILED DESCRIPTION

It is desirable from a filtering point of view to be able to represent I and Q magnitudes in a phase modulation system with a minimum number of states. If $\pi/4$ DQPSK could be represented in terms of regular DQPSK, the I and Q magnitudes could be constrained to just two values instead of the four otherwise required. This would result in a significant simplification of the filtering task. The following discussion explains how this simplification is realized.

Figure 3A:
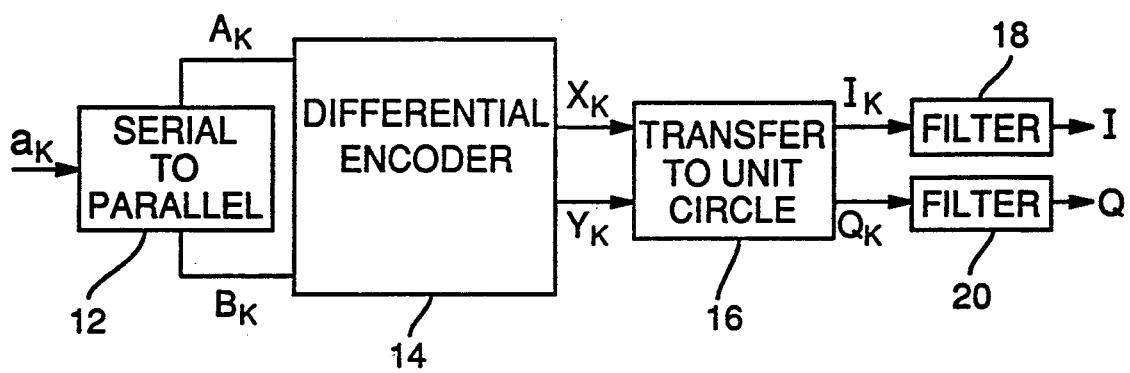
FIGS. 3A and 3B are block diagrams of a quadrature phase modulation system using conventional ROM addressing techniques.
Figure 3B:
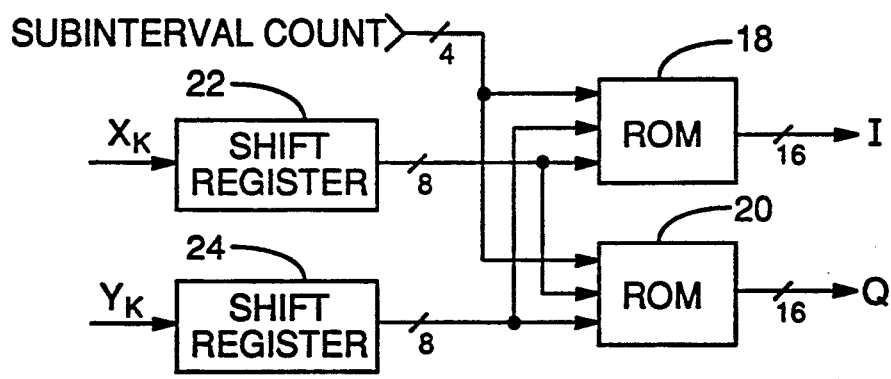
Figure 4A:
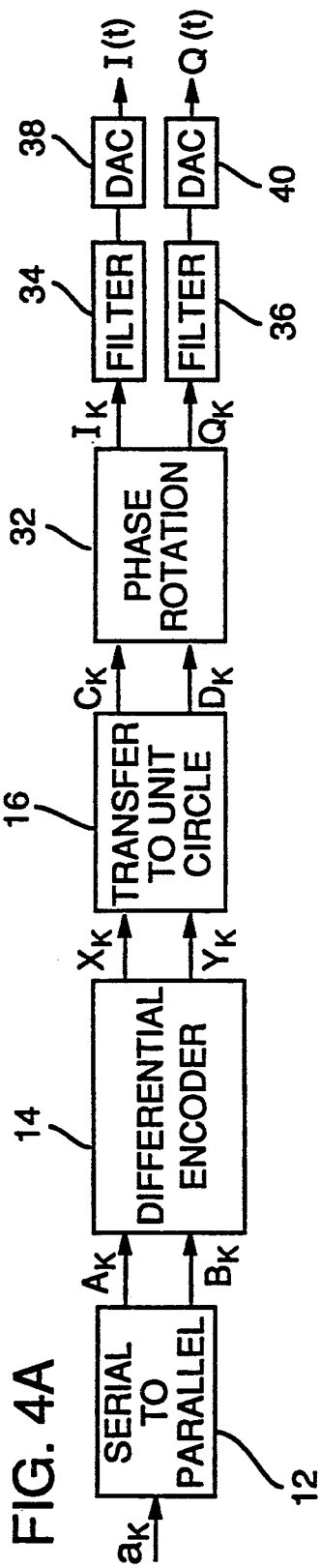
FIGS. 4A and 4B are block diagrams of a $\pi/4$ DQPSK modulator according to the illustrated embodiment of the present invention.

Referring first to FIG. 4A, a baseband modulation system 30 according to one embodiment of the present invention is identical to system 10 of FIG. 3A in its early stages, namely the serial to parallel, differential encoder, and "transfer to the unit circle" stages, 12, 14 and 16, respectively. (Again, the functionality of this latter stage is actually implemented as part of the data stored in the filter ROMs.) Up to this point, the modulation is strictly looking like DQPSK, i.e. it has only four possible states.

The phase rotation block 32 in FIG. 4A effects the transformation into $\pi/4$ DQPSK, as explained below. The functionality of this block is again implemented as part of the data stored in the filter ROMs.

The filters 34 and 36 perform a desired root Nyquist filtering operation on the input data and produce the desired filtered, phase-rotated I and Q outputs.

The digital output signals from the filters 34, 36 are applied to highly linear digital-to-analog converters 38, 40 to produce analog signals suitable for modulation of an RF carrier signal.

Blocks 32-36 are conceptual in nature and are presented in FIG. 4A only for purposes of expository convenience. In actual implementation, the functionality of these blocks is performed by the circuitry represented by FIG. 4B, namely shift registers 44, 46, "cosine" ROMs 48, 50, "sine" ROMs 52, 54, and adders 56, 58. The coordinate transformation that permits the $\pi/4$ DQPSK to be represented as DQPSK is effected as part of the data stored in ROMs 48-54. The derivation of this data is explained in the following discussion.

Mathematically, the conversions between the quadrature components ($C_k$, $D_k$) of a DQPSK signal to their counterparts in a corresponding $\pi/4$ DQPSK signal (as performed by conceptual block 32 of FIG. 4A) is a coordinate transformation that can be represented by the following two equations:

$$I_k = C_k \cos(k\pi/4) - D_k \sin(k\pi/4) \tag{3}$$

$$Q_k = C_k \sin(k\pi/4) + D_k \cos(k\pi/4) \tag{4}$$

where:

$C_k$ is the I component of the kth symbol of the DQPSK modulation;

$D_k$ is the Q component of the kth symbol of the DQPSK modulation;

$I_k$ is the I component of the kth symbol of the corresponding $\pi/4$ DQPSK modulation; and $Q_k$ is the Q component of the kth symbol of the corresponding $\pi/4$ DQPSK modulation.

These equations reflect a rotation from DQPSK of $\pi/4$ radians per symbol. (Note that $k\pi/4$ repeats every 8 symbols, indicating a modulo 8 behavior of the transformation.)

With this information as background, the contents of the ROMs 48-54 can now be considered.

To generate the desired output data, the input data must be convolved with the impulse response of the desired filter. A standard equation for this process is as follows:

$$Y(n) = \sum_k X(k)^* h(n - k) \tag{5}$$

where X(k) is the discrete data input stream, h(n−k) is the impulse response of the desired filter, and Y(n) is the output at time n.

The illustrated $\pi/4$ DQPSK modulation format uses a Nyquist type of bandpass filter to smooth the phase transition from state to state. Such a filter also provides good rejection of inter-symbol interference (ISI).

ISI is an interference mechanism wherein adjacent symbols interfere with each other by the time the data is received. This makes data detection more difficult. The theoretical minimum system bandwidth needed to detect 1/T symbols per second without ISI can be shown to be $\frac{1}{2}$T hertz. For this case, a rectangular filter shape in the frequency domain is required. Of course, a perfectly rectangular filter is difficult to approximate, so some compromise needs to be made. In the illustrated example, the bandwidth is increased to reduce the complexity of the filter realization. The modification to the filter is defined by a term called the filter roll-off factor. Let $W_0$ represent the theoretical minimum bandwidth $\frac{1}{2}$T. Let W represent the actual bandwidth of the filter. The rolloff factor, $\alpha$, is defined to be:

$$\alpha = (W - W_o)/W_o \tag{6}$$

Figure 1:
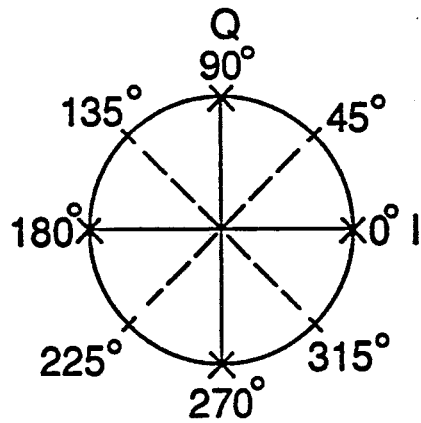
FIG. 1 is an I-Q diagram of the phase states of QPSK and DQPSK modulation.
Figure 2:
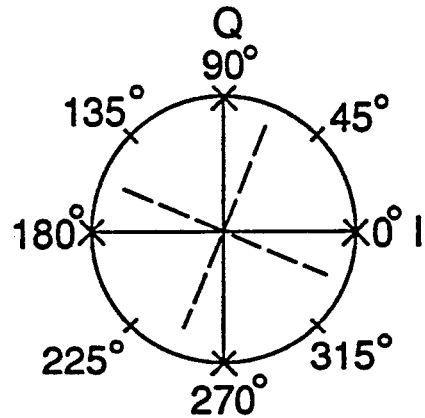
FIG. 2 is an I-Q diagram of the phase states of $\pi/4$ DQPSK modulation.
Figure 5:
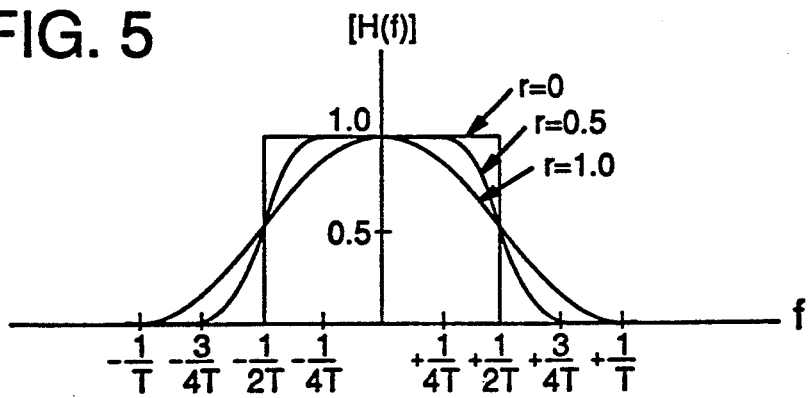
FIG. 5 illustrates the frequency response for a Nyquist filter for several values of $\alpha$.

The roll-off factor represents the excess bandwidth divided by the filter −6db bandwidth. FIG. 5 illustrates the frequency response of a Nyquist filter for several values of $\alpha$. Note how the amplitude response is −6db down at the theoretical minimum bandwidth point, regardless of the value of $\alpha$ chosen.

FIG. 6 shows the impulse response of a Nyquist filter with an $\alpha$ of 0.35. By examining this response, one can see that the impulse response crosses through nulls at multiples of the symbol interval, T. The ISI is eliminated when this filter is used.

With this background on Nyquist filters, the root Nyquist filter that is used in the preferred embodiment is next examined. To achieve optimum signal to noise ratio, a matched filter situation is used. That is, a similar filter is used in both the modulator and demodulator. To accomplish this, the Nyquist filter frequency response is modified by taking the square root of this function. This yields a root Nyquist filter. The $\alpha$ of the filter is the same as the original Nyquist filter. FIG. 7 shows the impulse response of a root Nyquist filter with an $\alpha$ of 0.35. Note that, in contrast to the Nyquist filter of FIG. 8, the impulse response of the root filter does not have nulls at multiples of the symbol interval. (FIG. 8 compares the Nyquist and root Nyquist impulse responses.) The lack of nulls at multiples of the symbol interval in the root Nyquist impulse response indicates that there will be ISI for this filter characteristic. The ISI problem is rectified in that the demodulator has another root Nyquist filter. When the modulated data is filtered by the demodulator filter, the received data has no ISI. This is the filter arrangement chosen for the US cellular communications system.

In the following discussion, g() represents the root Nyquist filter impulse response (FIG. 7), i.e. the $\pi/4$ DQPSK filter's impulse response. Note that for convenience, the impulse response has been shifted in time from 0 to the filter length. This choice prevents having any negative time representations for the filter impulse response in the descriptions that follow.

With the above as background, it can be seen that:

$$I(t) = \sum_k I_k{}^*g(t - kT) \tag{7}$$

$$Q(t) = \sum_k Q_k{}^*g(t - kT) \tag{8}$$

where T is the symbol interval, and k is the kth element of $I_k$ or $Q_k$.

Substituting in the expressions for the coordinate transformation from DQPSK to $\pi/4$ DQPSK yields:

$$I(t) = \sum_k C_k{}^*\cos(k\pi/4){}^*g(t - kT) - \sum_k D_k{}^*\sin(k\pi/4){}^*g(t - kT) \tag{9}$$

$$Q(t) = \sum_k C_k{}^*\sin(k\pi/4){}^*g(t - kT) + \sum_k D_k{}^*\cos(k\pi/4){}^*g(t - kT) \tag{10}$$

(The first summation of I(t) is referred to as a "cosine" term and the second term is referred to as a "sine" term. Likewise, the first term of Q(t) is referred to as a "sine" term and the second as a "cosine" term.)

Considering the first term of I(t), it can be seen that:

$$I_1(t) = \sum_{k=INT(t/T-L+1)}^{INT(t/T)} C_k^* \cos(k\pi/4)^* g(t - kT) \quad (11)$$

where L is the length of the filter impulse response in symbols.

When these limits of summation are referred to the impulse response, it can be seen that $g(t-kT)$ has limits of $g((L-1)T$ to $g(0)$. These limits agree with FIG. 7, which has the impulse response defined from 0 to L.

If $t=t_1+nT$, where $0<t_1<T$ (as represented by FIG. 9), it can be seen that the resolution of t is determined by the desired number of subintervals that are computed. In the illustrated embodiment, there are 16 subintervals per symbol. The benefit of computing subinterval points is that the phase transition between symbol intervals may be smoothed and spectral energy controlled. 16 subintervals proves to allow a very smooth transition between phase states.

With the foregoing definition for $t_1$, it can be seen that the first term of I(t) can be stated as follows:

$$I_1(t_1) = \sum_{k=n-L+1}^{n} C_k^* \cos(k\pi/4)^* g[t_1 + (n - k)T] \quad (12)$$

Again, evaluating $g(t_1+(n-k)^*T)$ with these limits for k yields limits of $g(T_1+(L-1)^*T)$ and $g(t_1)$. These limits still agree with the impulse response definition of FIG. 7.

The expression can be further simplified by changing variables as follows:

let $j=n$, $N=L$, and $I=-k+j$; then $k=j-i$

In this case, the limit $k=j-1+1$ becomes $i=N-1$, and the limit $k=j$ becomes $i=0$.

The limits of summation are now in the same terms as the impulse response length. The first term of I(t) can thus be written as:

$$I_1(t_1) = \sum_{i=0}^{N-1} C_{j-1}^* \cos[(j - 1)\pi/4]^* g(t_1 + iT) \quad (13)$$

From this expression, the information necessary to compute $I_1(t_1)$ is clear:

(1) $t_1$ is the time from the most recent data symbol occurring at $t=jt$. If 16 subintervals are used, 4 bits will be required to represent $t_1$ for the look-up ROM address;

(2) $C_j$ is the most recent input bit. $C_{j-N+1}$ is the input bit furthest in the past. There are $N_V$ values of $C_{j-i}$ used in the computation.

(3) j is the input bit counter. Since $\cos[(j-i)\pi/4]$ has a period of 8, input bits may be counted modulo 8. This implies 3 address bits will be required for this part of the ROM address.

The number of address bits for the ROM look-up table can now be determined. In the illustrated embodiment, there are 16 subintervals (requiring 4m bits), modulo 8 for the input bit counter (3 bits N) and a filter length of 8. Therefore, a total of $8+4+3=15$ bits is needed to address the resultant $I_1(t)$ from the ROM look-up table. This contrasts with the 20 address bits required for the conventional approach.

With the foregoing information, the final design equations for the look-up ROMs can be determined:

$$I(t_1) = \sum_{i=0}^{N-1} C_{j-i}^* \cos[(j - i)\pi/4]^* g(t_1 + iT) - \quad (14)$$

$$\sum_{i=0}^{N-1} D_{j-i}^* \sin[(j - i)\pi/4]^* g(t_1 + iT)$$

$$Q(t_1) = \sum_{i=0}^{N-1} C_{j-i}^* \sin[(j - i)\pi/4]^* g(t_1 + iT) + \quad (15)$$

$$\sum_{i=0}^{N-1} D_{j-i}^* \cos[(j - i)\pi/4]^* g(t_1 + iT)$$

where $t_1=t-nT$, $nT<t<(n+1)T$

Figure 4B:
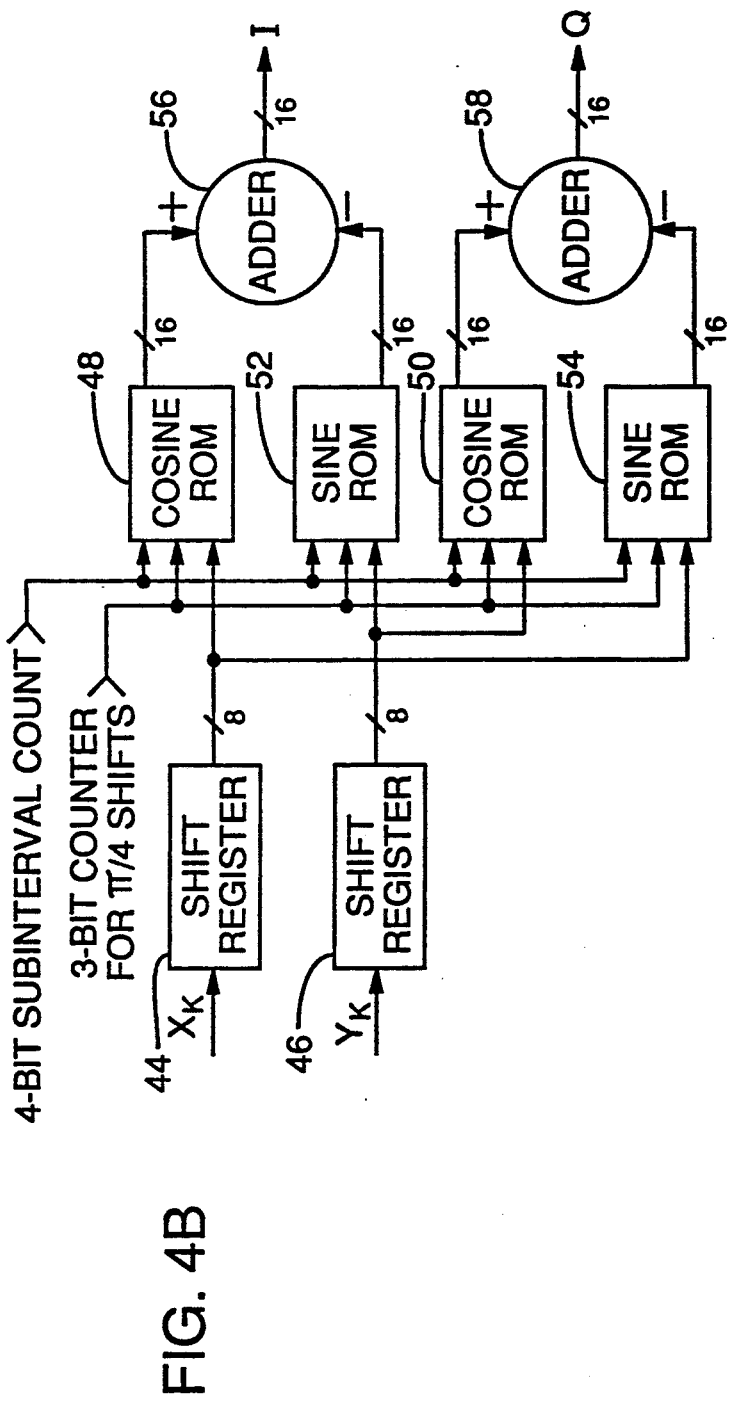

In FIG. 4B, the cosine ROMs contain the cosine summation terms, i.e. the first term listed in the I expression, and the second term listed in the Q expression. Notice that the only difference between these two parts of these equations is the input data (i.e. $C_k$ vs. $D_k$). If a ROM is constructed which contains all output values for all combination of input data bits, one ROM can be used for both the I and Q equation. The same logic applies for the sine ROM as well. The addition and subtraction shown in FIG. 4B correspond to the I and Q equations shown above.

The lowest four order bits of the sine/cosine ROM addresses represent the 16 subintervals per symbol. The next three bits are used to address the modulo 8 bit counter. These seven bits are common to all four ROMs. The buffered $X_k$ binary data stream from shift register 44 provides the eight most significant address bits for cosine ROM 48 and sine ROM 54. The buffered $Y_k$ binary data stream from shift register 46 provides the eight most significant address bits for sine ROM 52 and cosine ROM 50. The Q output is then formed by a straight addition of the outputs of ROMs 50 and 54 by adder 56. The I output is formed by subtraction of the output of ROM 52 from the output of ROM 48 by adder 58. The results of these addition and subtraction operations yield two parallel data streams that are provided to digital-to-analog converters 38, 40 to yield the desired output signals.

Having described and illustrated the principles of our invention with reference to a preferred embodiment thereof, it will be apparent the invention can be modified in arrangement, detail and application without departing from such principles. Accordingly, we claim as our invention all such modifications as may come within the scope and spirit of the following claims and equivalents thereto.

We claim:

1. In a digital filtering methodology wherein N samples of a digital input signal comprised of M-bit symbols are decomposed into first and second input signals and are used in addressing a memory in order to produce desired I and Q output signals, said output signals corresponding to the first and second input signals filtered with desired filter characteristics, an improvement comprising the steps:

providing a plurality of memories in which predetermined partial sum signal terms can be looked up as functions of address bits applied thereto, the predetermined partial sum signal terms being combinable to form the desired I and Q output signals, each of the predetermined partial sum signal terms being a function of less than M*N bits;

deriving address bits for each of said memories from the N samples of the digital input signal;

addressing the memories with the derived address bits corresponding thereto to produce partial sum signal term outputs; and combining the partial sum signal term outputs produced from said memories to yield the desired I and Q output signals.

2. The method of claim 1 in which the predetermined partial sum signal terms include a sine term and a cosine term.

3. The method of claim 1 which further comprises converting the desired I and Q output signals into analog form and modulating an RF signal with said analog signals.

4. In a digital filtering methodology wherein N samples of a digital input signal comprised of M-bit symbols are decomposed into first and second input signals and are used in addressing a memory in order to produce first and second desired output signals, said output signals corresponding to the first and second input signals filtered with desired filter characteristics, an improvement comprising the steps:

providing a plurality of memories in which predetermined signal terms can be looked up as functions of address bits applied thereto, the predetermined signal terms being combinable to form the first and second desired output signals, each of the predetermined signal terms being a function of less than M*N bits;

deriving address bits for each of said memories from the N samples of the digital input signal;

addressing the memories with the derived address bits corresponding thereto to produce signal term outputs; and combining the signal term outputs produced from said memories to yield the first and second desired output signals;

said combining step comprising summing the outputs produced from first and second of said memories, and taking the difference between the outputs produced from third and fourth of said memories.

5. In a digital filtering methodology wherein N samples of a digital input signal comprised of M-bit symbols are decomposed into first and second input signals and are used in addressing a memory in order to produce first and second desired output signals, said output signals corresponding to the first and second input signals filtered with desired filter characteristics, an improvement comprising the steps:

providing a plurality of memories in which predetermined signal terms can be looked up as functions of address bits applied thereto, the predetermined signal terms being combinable to form the first and second desired output signals, each of the predetermined signal terms being a function of less than M*N bits;

deriving address bits for each of said memories from the N samples of the digital input signal;

addressing the memories with the derived address bits corresponding thereto to produce signal term outputs; and combining the signal term outputs produced from said memories to yield the first and second desired output signals, said combining step including providing outputs produced from said memories to a digital adder.

6. In a DQPSK modulation technique comprising the steps:

providing a series of input data comprised of two-bit symbols;

processing the series of input data to yield first and second digital data streams;

differentially encoding the first and second digital data streams;

buffering the differentially encoded first and second data streams into two words, $N_1$ and $N_2$, each of said words being comprised of N bits;

generating a cycling M-bit subinterval count;

using the two N-bit words, in conjunction with the cycling M-bit subinterval count, to address look-up table-based filters to thereby produce filtered I and Q output data;

an improvement wherein the look-up tables in said filters can be addressed with a number of address bits less than $N+N+M$, the improvement comprising:

defining each of the I and Q outputs in terms of sums and differences of sine terms and cosine terms;

providing a first memory that serves as a look-up table for the sine term in response to an input datum applied as an address thereto, the input datum comprising N-bit word $N_1$, the M-bit subinterval counter, and a P-bit modulo counter, where P is less than N;

providing a second memory that serves as a look-up table for the cosine term in response to an input datum applied as an address thereto, the input datum comprising N-bit word $N_1$, the M-bit subinterval counter, and the P-bit modulo counter;

providing a third memory that serves as a look-up table for the sine term in response to an input datum applied as an address thereto, the input datum comprising N-bit word $N_2$, the M-bit subinterval counter, and the P-bit modulo counter;

providing a fourth memory that serves as a look-up table for the cosine term in response to an input datum applied as an address thereto, the input datum comprising N-bit word $N_2$, the M-bit subinterval counter, and the P-bit modulo counter; and summing the outputs from two of said memories and computing the differences between the outputs of two of said memories to yield filtered digital I and Q output signals;

wherein the look-up tables are each addressed by just $N+M+P$ bits, instead of $N+N+M$ bits.

7. In a method of DQPSK modulation in which input data symbols are decomposed into first and second components and filtered to produce first and second components of an output data signal, an improvement comprising:

producing the first output data signal by addressing a plurality of look-up table memories with addresses derived from the components of the input data symbols to yield a plurality of partial sums, and summing said partial sums to produce the first output data signal; and producing the second output data signal by addressing a plurality of look-up table memories with addresses derived from the components of the input data symbols to yield a plurality of partial sums, and summing said partial sums to produce the second output data signal.

8. The method of claim 7 in which:

producing the first output data comprises addressing a pair of look-up table memories with addresses derived from the components of the input data signal to yield a first pair of memory output signals and summing said first pair of memory output signals to product the first output data signal; and producing the second output data comprises addressing a pair of look-up table memories with addresses derived from the components of the input data signal to yield a second pair of memory output signals and summing said second pair of memory output signals to produce the second output data signal.

9. The method of claim 8 in which the first and second pairs of look-up tables contain identical data.

10. The method of claim 8 in which the same pair of look-up table memories is used in producing both the first and second output data.

11. A DQPSK baseband modulation system comprising:
   input means for receiving input symbol data;
   a differential encoder having an input coupled to said input means and having first and second outputs for providing first and second streams of output data bits, respectively;
   a first plurality of memories having address lines thereof coupled to the first output of the differential encoder;
   a second plurality of memories having address lines thereof coupled to the second output of the differential encoder; and
   first and second summing networks having inputs coupled to outputs of the memories, for producing first and second components of an output signal.

12. The modulation system of claim 11 in which:
   the first summing network has a first input coupled to an output of one of the first plurality of memories and a second input coupled to an output of one of the second plurality of memories.

13. In a digital filtering methodology wherein N samples of a digital input signal comprised of M-bit symbols are decomposed into first and second input signals and are used in addressing a memory in order to produce first and second desired output signals, said output signals corresponding to the first and second input signals filtered with desired filter characteristics, an improvement comprising the steps:
   providing a plurality of memories in which predetermined signal terms can be looked up as functions of address bits applied thereto, the predetermined signal terms being combinable to form the first and second desired output signals, each of the predetermined signal terms being a function of less than M*N bits;
   deriving address bits for each of said memories from the N samples of the digital input signal;
   address the memories with the derived address bits corresponding thereto to produce signal term outputs; and
   combining the signal term outputs produced from said memories to yield the first and second desired output signals;
   said predetermined signal terms include a sine term and a cosine term being given by the following equations:

$$Y(t) = \sum_{i=0}^{N-1} C_{j-i} * \cos[(j-i)\pi/4] * g(t_1 + iT) +$$

$$\sum_{i=0}^{N-1} D_{j-i} * \sin[(j-i)\pi/4] * g(t_1 + iT).$$

* * * * *